(12) United States Patent
Yu et al.

(10) Patent No.: US 12,525,942 B2
(45) Date of Patent: Jan. 13, 2026

(54) METHOD OF DESIGNING ACOUSTIC WAVE RF FILTER TO BE ROBUST TO VARIATION IN FREQUENCY RESPONSE IN PASS BAND THROUGH RESONANCE FREQUENCY MODULATION OF IDT

(71) Applicant: WiPAM, Inc., Seongnam-si (KR)

(72) Inventors: Dae Kyu Yu, Seoul (KR); Kyoung Joon Min, Seongnam-si (KR); Kyung Oh Kim, Seoul (KR)

(73) Assignee: WiPAM, Inc., Seongnam-si (KR)

( * ) Notice: Subject to any disclaimer, the term of this patent is extended or adjusted under 35 U.S.C. 154(b) by 601 days.

(21) Appl. No.: 18/084,554

(22) Filed: Dec. 20, 2022

(65) Prior Publication Data

US 2024/0154593 A1 May 9, 2024

(30) Foreign Application Priority Data

Oct. 26, 2022 (KR) .......................... 10-2022-0139078

(51) Int. Cl.
*H03H 3/10* (2006.01)
*H03H 9/02* (2006.01)

(52) U.S. Cl.
CPC .......... *H03H 3/10* (2013.01); *H03H 9/02834* (2013.01)

(58) Field of Classification Search
CPC .. H03H 3/10; H03H 9/14582; H03H 9/02834; H03H 9/6483; H03H 9/02574; H03H 9/14541; H03H 9/25
USPC ......................................... 333/17.1, 193–196
See application file for complete search history.

(56) References Cited

U.S. PATENT DOCUMENTS

| | | | |
|---|---|---|---|
| 7,750,752 B1 * | 7/2010 | Kosinski | H03H 9/6403 333/17.1 |
| 7,932,789 B2 * | 4/2011 | Hay | H03H 9/6403 331/107 A |
| 9,571,065 B2 * | 2/2017 | Kare | H03H 9/145 |
| 2011/0012696 A1 * | 1/2011 | Skarp | H03H 9/6403 333/195 |

* cited by examiner

*Primary Examiner* — Jorge L Salazar, Jr.
(74) *Attorney, Agent, or Firm* — Revolution IP, PLLC

(57) ABSTRACT

The present invention provides a method for design acoustic wave RF filter robust against variations of frequency response in passband by resonance frequency modulation of IDT enabling to improve the skirt characteristics in the passband of the filter by resonance frequency modulation with respect to the IDT electrodes of the resonators constituting the acoustic wave filter and determining the design parameters for the IDT electrodes based on the resonance frequency modulation so as to compensate for variations in frequency response due to effects of temperature variations as well as other factors.

4 Claims, 9 Drawing Sheets

PRIOR ART

PRIOR ART

METHOD OF DESIGNING ACOUSTIC WAVE RF FILTER TO BE ROBUST TO VARIATION IN FREQUENCY RESPONSE IN PASS BAND THROUGH RESONANCE FREQUENCY MODULATION OF IDT

ACKNOWLEDGEMENTS

National R&D project supporting this invention
[Assignment No.] 2020-0-00845
[Name of department] Ministry of Science and ICT
[Research and management institution] Information and Communication Planning and Evaluation Institute
[Research project name] 5G-based equipment terminal parts and device technology development
[Research Project Title] Development of high efficiency LPAMID for 5G NR terminals
[Research Management Specialized Institution] Korea Medical Device Development Fund
[Contribution rate] 1/1
[Supervised Research Institution] WiPAM, Inc.
[Research period] 3rd year (2022.01.01~2022.12.31)

BACKGROUND OF THE INVENTION

Field of the Invention

The present invention relates to an acoustic wave filter which is a band filter used in mobile communication devices that converts an electrical signal into an acoustic wave of a piezoelectric material using a piezoelectric effect of the piezoelectric material and converts the converted acoustic wave back into an electrical signal. Specifically, the present invention relates to a method of designing an acoustic wave RF filter to be robust to variation in frequency response in pass band of the filter through resonance frequency modulation.

Description of the Related Art

Since mobile devices such as smart-phones and tablets require small RF filters, acoustic filters using Surface Acoustic Wave (SAW) or Bulk Acoustic Wave (BAW) are mainly used, which have a much slower propagation speed than EM waves.

In the next generation mobile systems, more than 100 filters should be integrated into a small and limited area. Furthermore, more than 70 frequency spectrum bands are allocated in the frequency range of several hundred MHz to about 6 GHz. Thus, the filter design specification for next generation RF systems becomes much tighter than now.

An important consideration in filter design is to design robust filters for various factors such as process variations, marginal band and temperature variations that significantly affect the physical characteristics of RF devices.

FIG. 1 shows variation in response frequency according to temperature variation with respect to a SAW filter as an acoustic wave filter in prior arts. As shown in FIG. 1, variation in center-frequency of a resonator according to the temperature may lead to a failure in filter design.

In general, the center-frequency of a filter based on conventional SAW resonators may vary about +/- 5 MHz from -30° C. to 85° C. in the 2 GHz range. It is too large to be accepted in many RF filters.

To mitigate the center-frequency variation due to the temperature, TC-SAW (Temperature-Compensated SAW) which overlays silicon dioxide (SiO2) with additional processing steps are developed.

Since a TCF (Temperature Coefficient of Frequency) of the TC-SAW (about -20 ppm/° C.) is much less than that of the conventional SAW (about -40 ppm/° C.), the center-frequency variation of the filter due to the temperature using the TC-SAW can be substantially reduced.

However, since the today's integrated RF filters such as multiplexers and switches require to specify the much tighter band-to-band interference restrictions, even using TC-SAW, a decrease in frequency change with temperature is still necessary, and the robust characteristics against factors such as process variation, marginal band and temperature variations are a very important problem in filter design.

SUMMARY OF THE INVENTION

It is an object of the present invention to provide a method for design acoustic wave RF filter robust against variations of frequency response in passband by resonance frequency modulation of IDT enabling to improve the skirt characteristics in the passband of the filter by resonance frequency modulation with respect to the IDT electrodes of the resonators constituting the acoustic wave filter and determining the design parameters for the IDT electrodes based on the resonance frequency modulation so as to compensate for variations in frequency response due to effects of temperature variations as well as other factors.

A method of designing an acoustic wave RF filter to be robust to variation in frequency response in pass band through resonance frequency modulation of IDT according to an embodiment of the present invention comprises: modulating resonance frequency of an IDT electrode having periodic structure to resonance frequency of a modulated IDT electrode having non-periodic structure by allowing the IDT electrode to have non-periodic fingers; determining parameters for the modulated IDT electrode of non-periodic structure from changes of resonance frequencies of the acoustic wave resonators having the modulated IDT electrode parallel-connected and the modulated IDT electrode series-connected; and constructing the acoustic wave RF filter by connecting the acoustic wave resonators having the modulated IDT electrode according to the determined parameters in parallel and series.

Preferably, the modulating resonance frequency includes: constructing the non-periodic structure of the IDT electrode as a plurality of sub-IDT electrodes having different period lengths; and modulating to divide the resonance frequency of the IDT electrode having periodic structure into a plurality of resonance frequencies according to the plurality of sub-IDT electrodes having different period lengths, and to shift an anti-resonance frequency of the IDT electrode having periodic structure to an anti-resonance frequency according to the plurality of sub-IDT electrodes having different period lengths.

Preferably, the determining parameters for the modulated IDT electrode includes: determining each period length of each of the plurality of sub-IDT electrodes as the parameters when the amount of the modulated frequency of the resonance frequency of the resonator connected in parallel and the amount of the modulated frequency of the anti-resonance frequency of the resonator connected in series are maximized.

A method of designing an acoustic wave RF filter to be robust to variation in frequency response in pass band through resonance frequency modulation of IDT according to an embodiment of the present invention comprises: configuring an IDT electrode with a plurality of fingers having a period length p into m sub-IDTs having different period lengths $p_1$ to $p_m$; generating the resonance frequencies $f_{r1}$ to $f_{rm}$ into which are divided according to modulating a resonance frequency $f_r$ of the IDT electrode having period length p to the plurality of sub-IDTs having period lengths $p_1$ to $p_m$; generating the anti-resonance frequency $f_{a(m)}$ which is shifted according to modulating an anti-resonance frequency $f_{a(p)}$ of the IDT electrode having period length p to the plurality of sub-IDTs having period lengths $p_1$ to $p_m$; determining the period length of each of the plurality of sub-IDTs when the difference between the resonance frequency $f_r$ and the divided resonance frequency for the resonator having the plurality of sub-IDTs connected in parallel and the difference between the anti-resonance frequency $f_{a(p)}$ and the shifted anti-resonance frequency $f_{a(m)}$ for the resonator connected in series is maximized; and, constructing the acoustic wave RF filter by connecting the acoustic wave resonators having the sub-IDTs according to the determined period lengths in parallel and series.

DESCRIPTION OF THE PREFERRED EMBODIMENTS

The terms used in the present specification will be briefly described, and the present invention will be described in detail.

Terms used in the present invention have selected general terms currently widely used as possible while taking functions in the present invention into consideration, but this may vary depending on the intention or precedent of a technician engaged in the relevant field, the emergence of new technologies, and the like. In addition, in certain cases, there are terms arbitrarily selected by the applicant, and in this case, the meaning of the terms will be described in detail in the description of the corresponding invention. Therefore, the terms used in the present invention should be defined based on the meaning of the term and the overall contents of the present invention, not a simple name of the term.

When a part of the specification is said to "include" a certain element, it means that other elements may be further included rather than excluding other elements unless specifically stated to the contrary. In addition, terms such as "unit" and "module" described in the specification mean units that process at least one function or operation, which may be implemented as hardware or software, or as a combination of hardware and software.

Hereinafter, A method of designing acoustic wave RF filter to be robust to variation in frequency response in pass band through resonance frequency modulation of IDT according to embodiments of the present invention will be described in detail with reference to the drawings.

A method of designing an acoustic wave RF filter according to the present invention may be applied to the entire electric elements using the acoustic wave RF filter having an Inter Digital Transducer (IDT) structure such as XBAW, XBAR, and SAW. Hereinafter, the case where the present invention is applied to the SAW filter will be described as a representative example.

Figure 1:
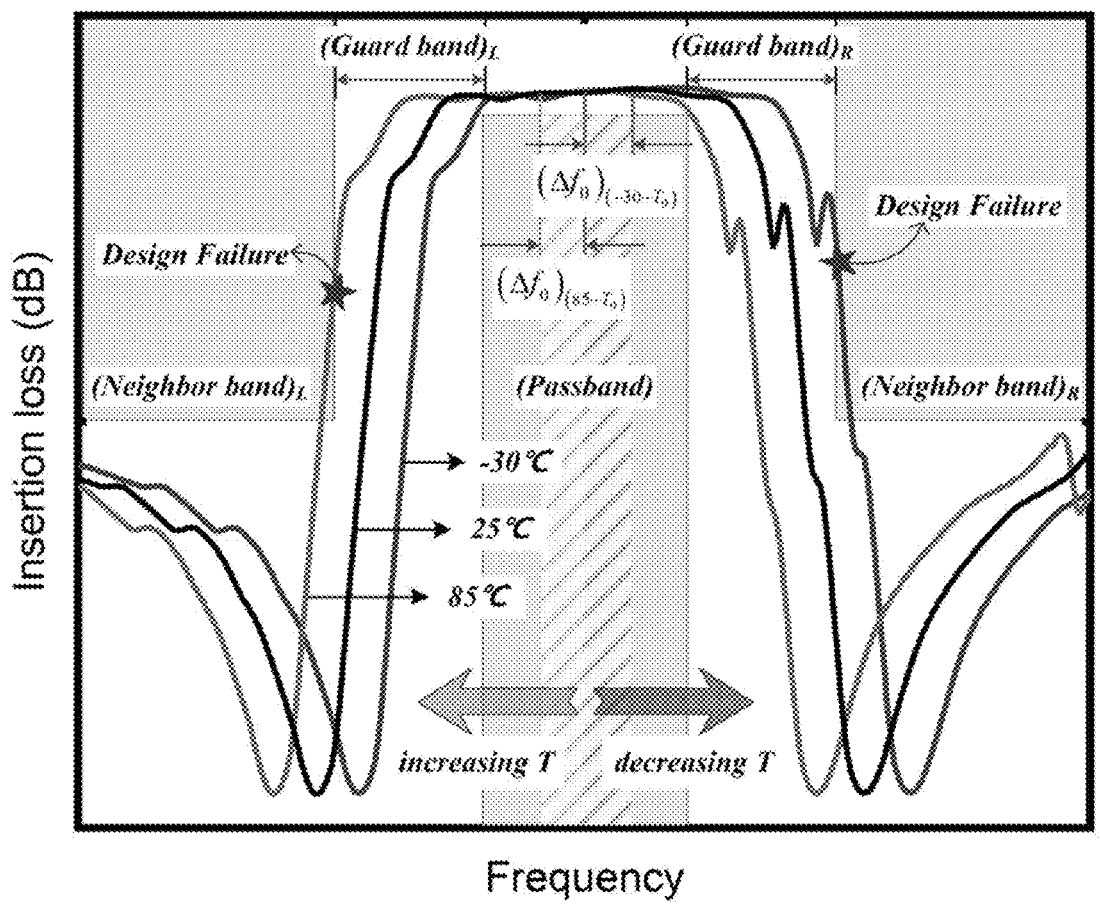
FIG. 1 shows variation in response frequency according to temperature variation in a conventional SAW filter.
Figure 2:
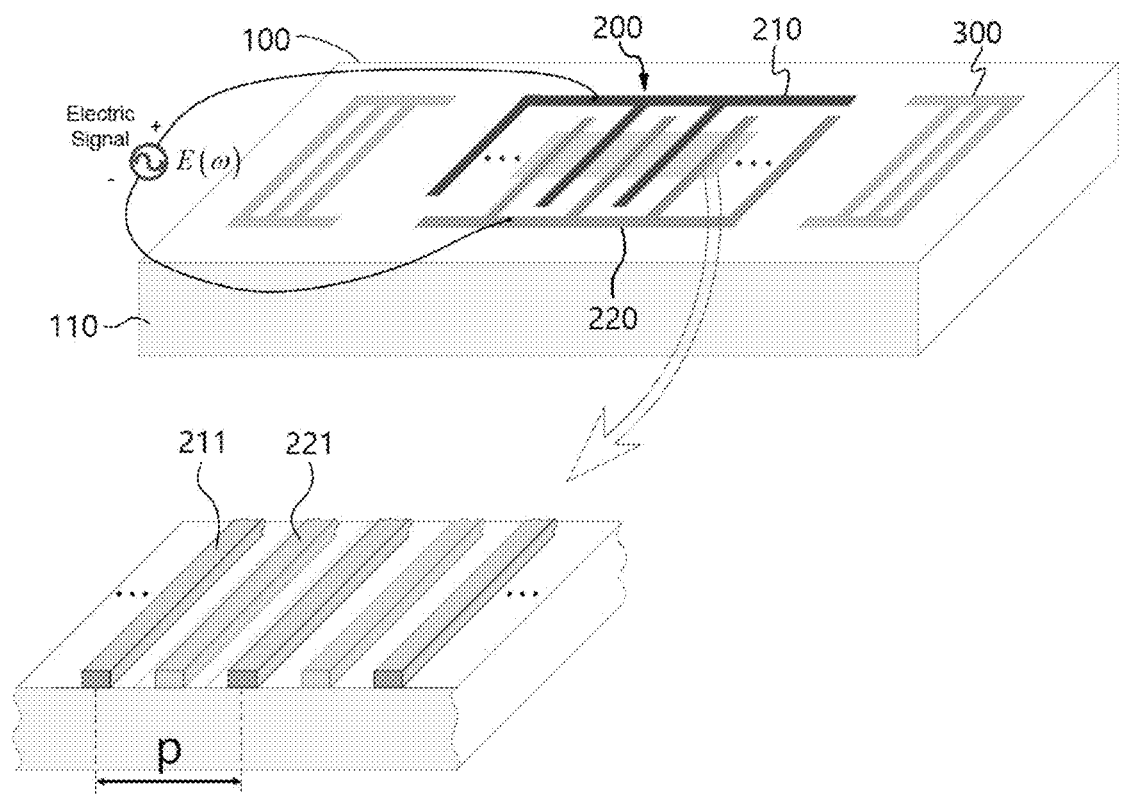
FIG. 2 shows the configuration of a conventional SAW resonator.

The SAW filter is designed by combining SAW resonators, and FIG. 2 shows a conventional type of SAW resonator.

The SAW resonator 100 as shown in FIG. 2 forms an IDT (Inter Digital Transducers) electrode 200 on the piezoelectric plate 110 to generate SAW (Surface Acoustic Wave) on the surface of the piezoelectric plate 110 from an electrical signal applied to the IDT electrode 200. Preferably reflectors 300 are provided at both ends of the IDT electrode 200 on the piezoelectric plate 110, so that the SAW generated by the IDT electrode 200 is not leaked to the outside and is reflected by each of the reflectors 300.

The IDT electrode 200 provided on the piezoelectric plate 110 may be formed of metal, and as shown in FIG. 2, the IDT electrode 200 is divided into an input IDT electrode unit 210 and an output IDT electrode unit 220. The input IDT electrode unit 210 may have a positive potential and the output IDT electrode unit 220 may have a negative potential.

The input IDT electrode unit 210 may include a plurality of input IDT fingers 211, and the output IDT electrode unit 220 may include a plurality of output IDT fingers 221.

Each of the input IDT fingers 211 and each of the output IDT fingers 221 may be alternately arranged one by one, and the length between the input IDT fingers or the length between the output IDT fingers is referred to as the period length p.

In general, the IDT electrode of the SAW resonator includes a plurality of fingers, and the IDT electrode is configured to have a single period length.

Since the IDT electrode of the SAW resonator has a periodic comb structure, the resonance characteristics are determined by solving wave equations with periodic boundary conditions so-called "coupled mode approach (CMA)". It is very useful and accurate in relatively low operating frequencies for the periodic structure having a single period length, whereas it has fundamental limitations for non-periodic structure of IDT.

Alternatively, the acoustic wave behaviors within the piezoelectric material of SAW IDT can be physically modeled with a pair of tensor equations between tractional force and acoustic velocity. Taking a suitable crystal direction as a longitudinal direction, the equations become a pair of differential equations which are mathematically the same as transmission line equations.

Thus, since the one-dimensional acoustic wave equations can be solved by using distributed network theory for electromagnetic waves [20], the technique is called "Electromagnetic-Acoustic Analogy (EAA). The biggest advantage of EAA (compared with the CMA) is far more flexible for the analyses of asymmetrical or non-periodic IDT structures.

That is, since an IDT finger can be represented with a differential section of the transmission line model, it can be well described with a distributed circuit model. Since the resonance frequency modulation of the SAW resonator according to the present invention exploits the non-periodic IDT characteristics, the EAA approach may be used.

Figure 3:
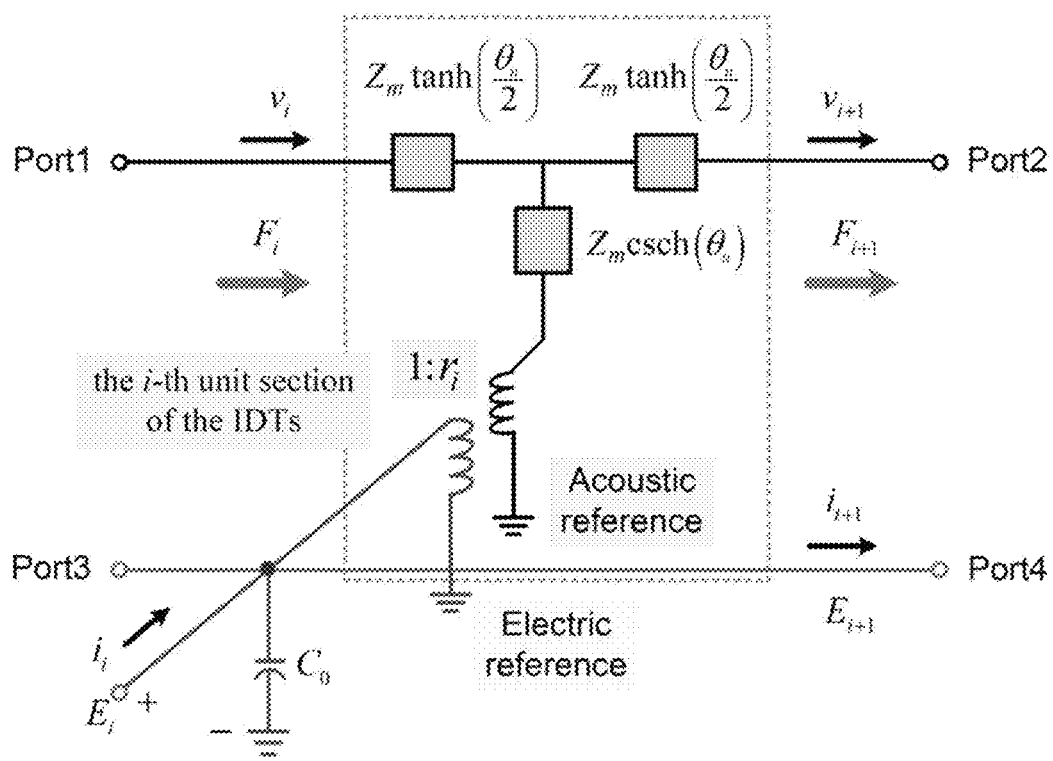
FIG. 3 shows a SAW IDT transmission line model represented by 4-port network parameters for a differential section of the SAW resonator.

Combining the electromechanical coupling effect with the acoustic transmission line model, a differential section for the IDT transmission line model can be represented as a 4-port network parameter as shown in FIG. 3. The 4-port cascade-matrix for a unit section that is defined as a differential length (1 u) may be represented by Equation 1 below.

$$\begin{bmatrix} T_i \\ v_i \\ E_i \\ i_i \end{bmatrix} = \begin{pmatrix} \cosh(\gamma_u l_u) & z_u \sinh(\gamma_u l_u) & r_i[1-\cosh(\gamma_u l_u)] & 0 \\ \frac{\sinh(\gamma_u l_u)}{z_u} & \cosh(\gamma_u l_u) & \frac{-\phi_i \sinh(\gamma_u l_u)}{z_u} & 0 \\ 0 & 0 & 1 & 0 \\ \frac{-r_i \sinh(\gamma_u l_u)}{z_u} & \phi_i[1-\cosh(\gamma_u l_u)] & j\omega C_o + \frac{(\phi_i)^2 \sinh(\gamma_u l_u)}{z_u} & 1 \end{pmatrix} \begin{bmatrix} T_{i+1} \\ v_{i+1} \\ E_{i+1} \\ i_{i+1} \end{bmatrix}$$ 
[Equation 1]

Here, parameters in the Equation 1 are defined as follows.
$\gamma_u = \alpha + j\beta$: the propagation constant
$E_i$: the i-th port potential
$I_i$: the i-th port current
$T_i$: stress at i-th port
$v_i$: particle velocity of the i-th port
$\omega$: angular frequency
$z_u$: the acoustic characteristic impedance
$\varphi_i$: the transformer ratio As shown in FIG. 3, SAW transmission line model is composed of five model parameters $M = \{v_o, v_m, k^2, \alpha, C_o\}$, where $v_o$ is the phase velocity of an acoustic wave without a metal loading effect, and vm is the phase velocity of an acoustic wave with a metal loading effect.

The acoustic velocity is presented in terms of the acoustic velocity ratio which is defined as $\tau \equiv v_o/v_m$. The a indicates the propagation loss of an acoustic wave. The $k^2$ is an electromechanical coupling coefficient and Co is a capacitance per a finger of IDT.

Figure 4:
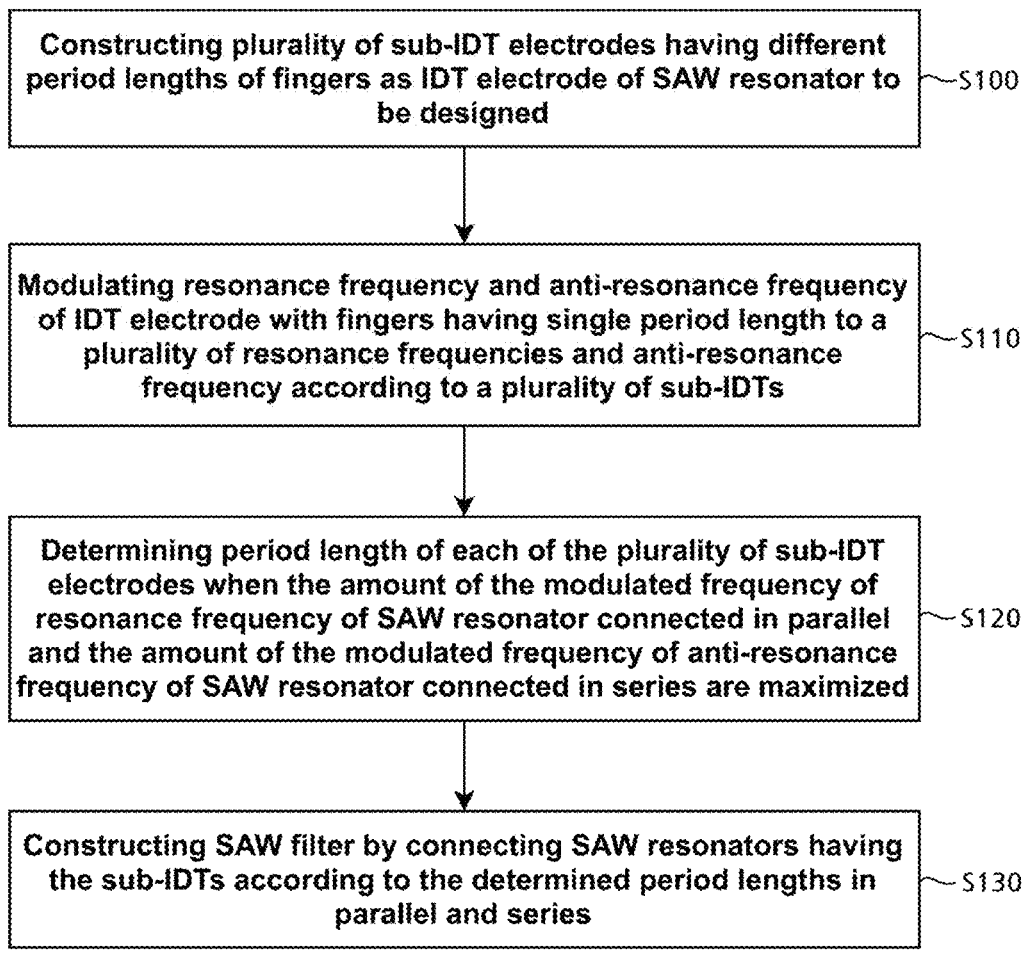
FIG. 4 is a flowchart showing a method of designing an acoustic wave RF filter according to an embodiment of the present invention, which is robust to frequency response variations in a pass band by resonance frequency modulation of IDT.

A method of designing acoustic wave RF filter to be robust to variation in frequency response in pass band through resonance frequency modulation of IDT according to the present invention will be described based on FIG. 4. FIG. 4 is a flowchart showing a method of designing an acoustic wave RF filter according to an embodiment of the present invention, which is robust to frequency response variations in a pass band by resonance frequency modulation of IDT.

The present invention is provided a method of designing the SAW filter to be robust to temperature variations by modulating the resonance frequency and the anti-resonance frequency according to the configuration of the IDT electrode having non-periodic structure unlike a general type of SAW resonator with a periodic structure, that is, an IDT electrode with a single periodic length of the plurality of fingers.

As shown in FIG. 4, in an embodiment of the present invention, the IDT electrode of the SAW resonator may be configured to include a plurality of sub-IDT electrodes having different period lengths (S100).

The resonance frequency and the anti-resonance frequency of the IDT electrode on a plurality of fingers having a single period length are modulated into a plurality of resonance frequencies and anti-resonance frequencies according to the plurality of sub-IDT electrodes (S110).

Here, "modulation" means a frequency change, such as dividing the previous resonance frequency into multiple different resonance frequencies and moving the previous anti-resonance frequency, as the IDT electrode of the SAW resonator is composed of multiple sub-IDT electrodes with different period lengths rather than a single period length.

The SAW filter may be configured by connecting the SAW resonator having the IDT electrode according to the modulation in parallel and in series. The period length of each of the plurality of sub-IDT electrodes when the amount of the modulated frequency of the resonance frequency of the SAW resonator connected in parallel and the amount of the modulated frequency of the anti-resonance frequency of the SAW resonator connected in series are maximized, may be determined (S120). The SAW filter according to an embodiment of the present invention may be designed by serial-connecting and parallel-connecting the plurality of sub-IDT electrodes having the determined period length (S130).

By improving the skirt characteristics on the response frequency of the SAW filter through the modulation of the IDT electrode in the above-described way so as to compensate for temperature variations, it is possible to configure the SAW filter that is robust to temperature variations.

The method of designing the SAW filter according to an embodiment of the present invention as described above will be described in more detail with reference to FIGS. 5 to 9.

Figure 5A:
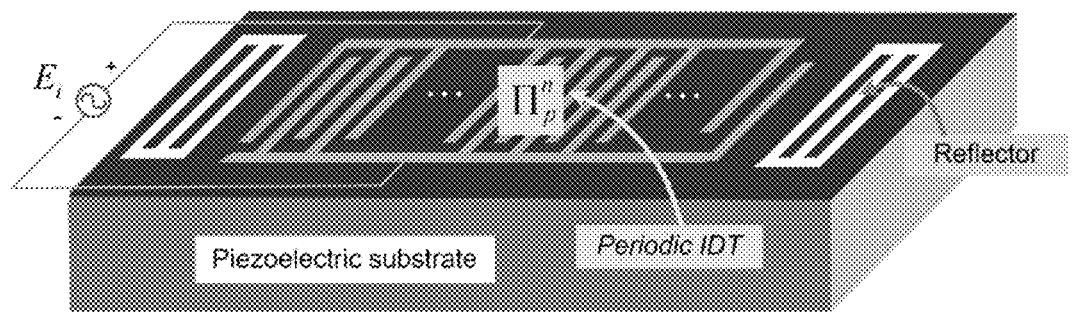
FIG. 5A shows a SAW resonator of an IDT electrode having a single period length of fingers.
Figure 5B:
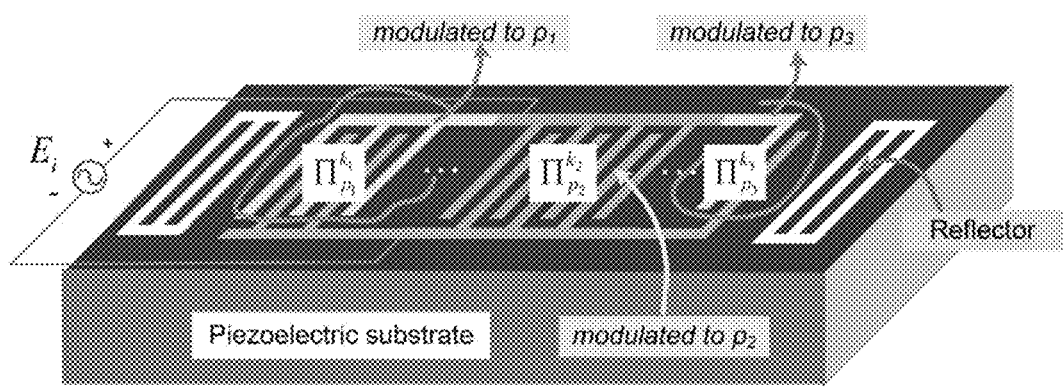
FIG. 5B shows a SAW resonator having fingers consisting of a plurality of sub-IDT electrodes having different period lengths.

FIG. 5A shows a SAW resonator of an IDT electrode having a single period length of fingers, and FIG. 5B shows a SAW resonator having fingers consisting of a plurality of sub-IDT electrodes having different period lengths.

The basic structure of a SAW IDT is a periodic structure in which a positive finger and a negative finger arranged by turns are configured in a periodic pattern as shown in FIG. 5A. For the mathematical formulation of SAW resonator modulation, SAW IDT can be represented in symbolic notation, as shown in Equation 2 below if there are n fingers in the SAW IDT and the period length is p.

$SAW_{IDT}\{p, n\} \rightarrow \Pi_p^n$ [Equation 2]

Here, "$\Pi$" denotes IDT, "n" denotes the number of fingers, and "p" denotes the period length of the IDT.

The modulation of an IDT means that a uniform array of an n-fingers with its periodic length p is reconfigured with the other IDT structure with multiple periodic lengths as shown in FIG. 5B. Thus, if an IDT with a periodic length p and total number of fingers "n" is modulated into the other IDT with m-multiple periodic lengths, it is represented with a symbolic notation as shown Equation 3 below.

$$\langle \Pi_p^n \rangle_{mod}{}^m \rightarrow \langle \Pi_{p_1}^{k_1}, \Pi_{p_2}^{k_2}, \ldots \Pi_{p_m}^{k_m} \rangle \qquad \text{[Equation 3]}$$

The left side part of Equation 3 means that the IDT electrodes composed of n fingers having a period length p are modulated into m sub-IDT electrodes. The right side of Equation 3 represents m sub-IDT electrodes, which represents a sub-IDT electrode consisting of $k_1$ fingers with a period length $p_1$, a sub-IDT electrode consisting of $k_2$ fingers with a period length $p_2$, and a sub-IDT electrode consisting of km fingers with a period length $p_m$.

The IDT of the uniform SAW resonator as shown in FIG. 5A may generate two resonance frequencies according to the period length p, and may be represented as a "resonance frequency $f_r$" and a "anti-resonance frequency $f_a$" considering the admittance.

Modulated to two distinct period lengths, the simplest structure, Equation 3 above can be expressed as $\langle \Pi_p^n \rangle_{mod}{}^2 \rightarrow \langle \Pi_{p_1}^{k_1}, \Pi_{p_2}^{k_2} \rangle$, and the previous resonance frequency $f_r^p$ corresponding to the period length p is modulated to IDT having two period lengths $p_1$, $p_2$, and divided into two spurious resonance frequencies $f_{r1}$, $f_{r2}$.

The two modulated resonance frequencies are distinguished a frequency on the lower side ($f_{r1} \equiv f_{r(low)}$) and a frequency on the higher side ($f_{r2} \equiv f_{r(high)}$).

On the other hand, the anti-resonance frequency $f_a$ is shifted instead of being divided, wherein the shifted frequency is $f_{a1}$.

Therefore, two resonance frequencies and one anti-resonance frequency occur according to the modulation using two different period lengths $p_1$ and $p_2$, and can be expressed as Equation 4 below.

$$\langle f_r^p, f_a^p \rangle_{mod}{}^2 \rightarrow \langle f_{r1}, f_{r2}, f_{a1} \rangle \qquad \text{[Equation 4]}$$

Figure 6A:
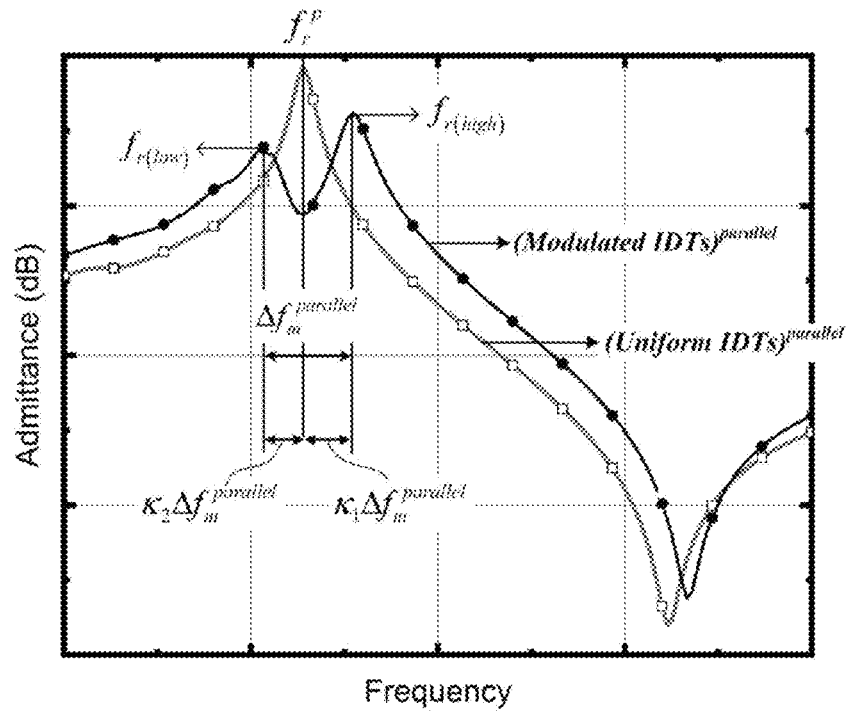
FIGS. 6A and 6B are graphs showing frequency characteristics when an IDT comprising n fingers with a period length p is modulated according to two distinct period lengths p1 and p2.
Figure 6B:
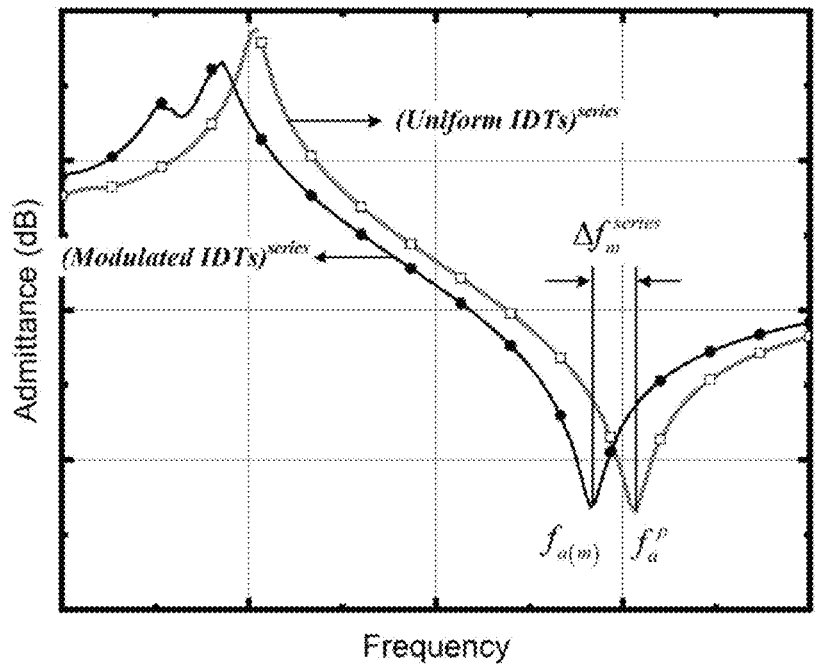

FIG. 6 shows the frequency characteristics when IDT composed of n fingers with the period length p is modulated according to two distinct period lengths $p_1$ and $p_2$, that is in the case of $\langle \Pi_p^n \rangle_{mod}{}^2 \rightarrow \langle \Pi_{p_1}^{k_1}, \Pi_{p_2}^{k_2} \rangle$ In other words, in the case of $p_2 > p > p_1$ of $\langle \Pi_p^n \rangle_{mod}{}^2 \rightarrow \langle \Pi_{p_1}^{k_1}, \Pi_{p_2}^{k_2} \rangle$, FIG. 6A shows the frequency response characteristic curve (Uniform IDTs)$^{parallel}$ when a plurality of SAW resonators corresponding to period length p are connected in parallel and the frequency response characteristic curve (Modulated IDTs)$^{parallel}$ when multiple SAW resonators modulated to period lengths $p_1$ and $p_2$ are connected in parallel. In the case of $p_2 > p_1 = p$ of $\langle \Pi_p^n \rangle_{mod}{}^2 \rightarrow \langle \Pi_{p_1}^{k_1}, \Pi_{p_2}^{k_2} \rangle$, FIG. 6B shows the frequency response characteristic curve (Uniform IDTs)$^{series}$ when a plurality of SAW resonators corresponding to period length p are connected in series and the frequency response characteristic curve (Modulated IDTs)$^{series}$ when multiple SAW resonators modulated to period lengths $p_1$ and $p_2$ are connected in series.

If SAW resonators with a period length p is series-connected, it rejects the high frequency signals higher than the frequency $f_a^p$. On the contrary, if SAW resonators with a period length p is parallel-connected, it rejects the low frequency signals lower than the frequency $f_r^p$.

Therefore, the filter skirt characteristics of the left side of the passband as shown in FIG. 6A is concerned with the parallel-connected resonators, whereas the filter skirt characteristics of the right side of the passband as shown in FIG. 6B is concerned with the series-connected resonators.

As described above, if SAW resonator is modulated with two distinct period lengths (($p_1$, $p_2$)∀($p_2 > p > p_1$)), the resonance frequency is divided into two spurious resonance frequencies $f_{r1}$ ($f_{r(low)}$) and $f_{r2}$ ($f_{r(high)}$) as shown in FIG. 6A.

Here, when "the amount of the modulation frequency" $\Delta f_m$ is defined as the difference of two spurious resonance frequencies, the modulation frequency of the parallel-connected resonator is defined as Equation 5 below.

$$\Delta f_m^{parallel} \equiv f_{r(high)} - f_{r(low)} \qquad \text{[Equation 5]}$$

$$\begin{cases} f_{r(high)} \equiv f_r^p + \kappa_1 \Delta f_m^{parallel} \\ f_{r(low)} \equiv f_r^p - \kappa_2 \Delta f_m^{parallel} \end{cases} \forall (\kappa_1 + \kappa_2 = 1)$$

Furthermore, the modulation frequency ($f_{a(m)}$) of the anti-resonance frequency ($f_a^p$) of the series-connected resonator is defined as Equation 6 below.

$$\Delta f_m^{series} \equiv f_a^p - f_{a(m)} \qquad \text{[Equation 6]}$$

As shown in FIG. 6B, $\Delta f_m^{series}$ means an amount of movement of the anti-resonance frequency according to the modulation.

In the present invention, what is important in the design of SAW filters is to find both appropriate $\Delta f_m^{parallel}$ and $\Delta f_m^{series}$ according to the modulation of the resonance frequency.

For the resonance frequency modulation of the optimal parallel-connected resonators, i.e., $\langle \Pi_p^n \langle_{mod}{}^2$, it is preferable that the two distinct period lengths $p_1$ and $p_2$ for the modulation are determined so that the modulated IDT may make "$k_1 \Delta f_m^{parallel}$" according to Equation 5 be maximized.

If $p_2$ corresponding to the resonance frequency on the lower side $f_{r(low)}$ is selected, the $p_1$ should be the period length that maximizes $k_1 \Delta f m^{parallel}$ which can be represented as Equation 7 below.

$$p_1 \leftarrow (f_{r(low)} + \kappa_1 \Delta f_m^{parallel})_{max} \forall (p_2 > p_1) \qquad \text{[Equation 7]}$$

In practice, $p_1$ can be readily determined with only a few iterations by using the cascaded network model for the modulated IDT.

Figure 7A:
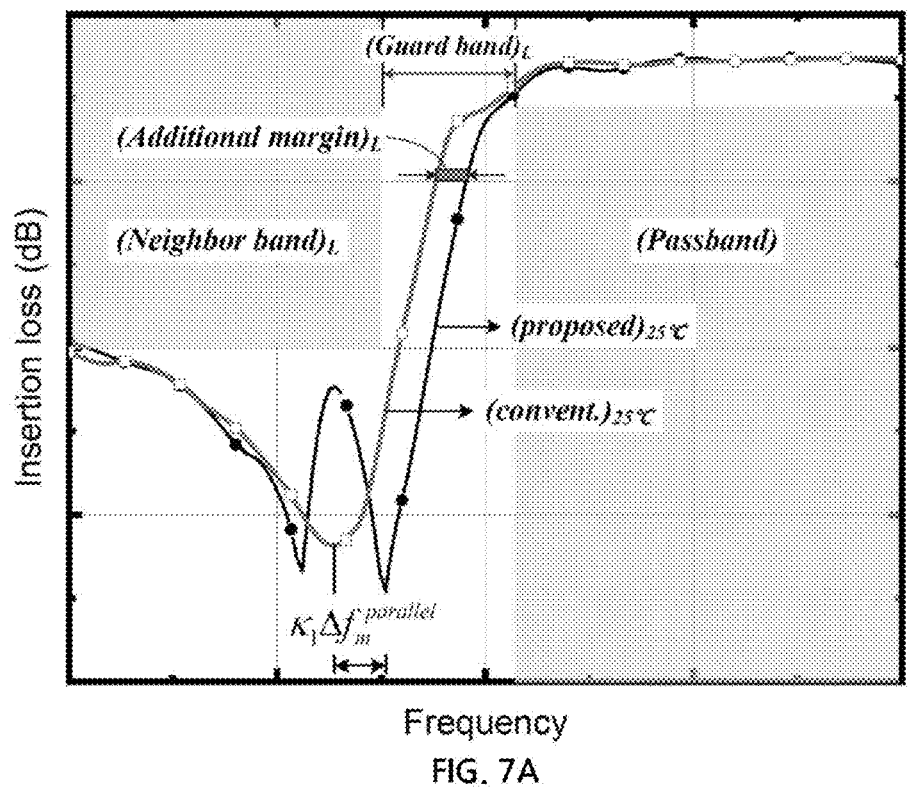
FIGS. 7A and 7B are graphs showing frequency characteristics of a SAW filter having parallel-connected resonators and series-connected resonators and frequency characteristics of a SAW filter having modulated parallel-connected resonators and series-connected resonators.
Figure 7B:
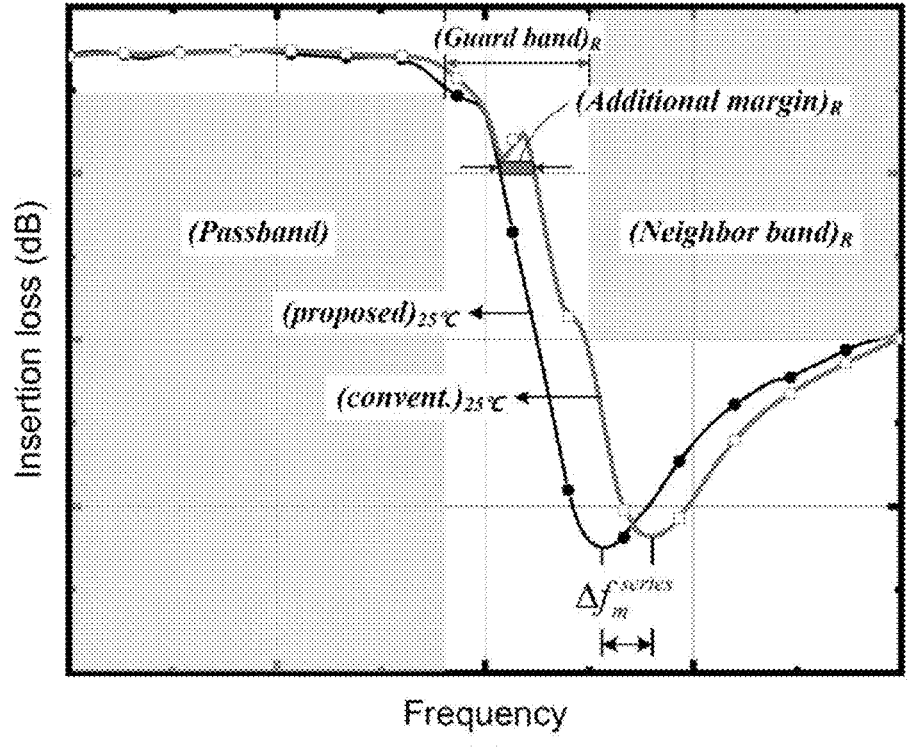

FIGS. 7A and 7B are graphs showing frequency characteristics, i.e., frequency characteristics compared to insertion loss, of a SAW filter having parallel-connected resonators and series-connected resonators and a SAW filter having modulated parallel-connected resonators and series-connected resonators. FIG. 7A shows frequency characteristics of the left side of the pass band, and FIG. 7B shows frequency characteristics of the right side of the pass band.

As shown in FIG. 7A, it can be seen that the filter skirt characteristics on the left side of the passband of the SAW filter can be substantially improved by the amount of "$k_1 \Delta f_m^{parallel}$".

Likewise, for the resonance frequency modulation of the optimal series-connected resonators, it is preferable that the period lengths $p_1$ and $p_2$ of the IDT electrode are determined so that the modulated IDT electrode can minimize the modulated frequency $f_{a(m)}$.

If $p_1$ corresponding to the anti-resonance frequency $f_a^p$ is selected, the $p_2$ should be the period length that maximizes $\Delta f_m^{series}$ which can be represented as Equation 8 below.

$$p_2 \leftarrow (\Delta f_m^{series})_{max} \forall (p_1 > p_2) \qquad \text{[Equation 8]}$$

In practice, $p_2$ can be readily determined with only a few iterations by using the cascaded network model for the modulated IDT.

As shown in FIG. 7B, it can be seen that the filter skirt characteristics on the right side of the passband of the SAW filter can be substantially improved by the amount of "$\Delta f_m^{series}$".

As the period length of each of the plurality of sub-IDT electrodes is determined when the amount of the modulated frequency of the parallel-connected SAW resonator and the amount of the modulated frequency of the anti-resonance frequency of the series-connected SAW resonator are respectively maximized, both the filter skirt characteristics on the left side and the filter skirt characteristics on the right side may be improved altogether. Since such an improvement in the filter skirt characteristics can provide compensation for frequency response variations, the acoustic wave RF filter designed through the frequency modulation as described above can be robust to such as process variations, marginal band, temperature variations.

Comparative data that may support the improvement of the skirt characteristics of the filter according to the modulation of the resonance frequency as described above will be described with reference to FIGS. 8 and 9.

FIG. 8 shows a SAW filter designed with SAW resonators having a uniform single period length and a frequency characteristic according thereto. FIG. 9 shows a SAW filter designed with SAW resonators to which a modulation technique of a resonance frequency according to an embodiment of the present invention is applied, and frequency characteristics according thereto. The design shown in FIG. 8 is referred to as a 'previous design', and the design shown in FIG. 9 is referred to as a 'modulation-based design'.

A test filter according to the previous design is a bandpass filter which can be specified as: its center frequency (2 GHz), its passband (1965 MHz to 2035 MHz), its rejection requirement (−40 dB), its fractional bandwidth (FBW) for both the left-hand and right-hand guard band (1.5%, i.e., 30 MHz), and the insertion loss (less than −2.5 dB).

Figure 8A:
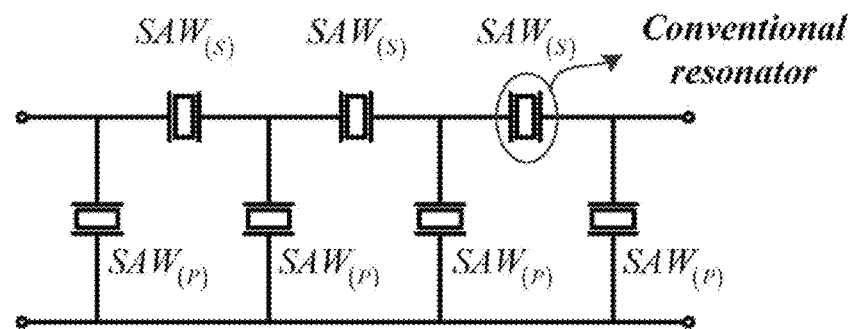
FIGS. 8A and 8B show a SAW filter designed with SAW resonators having a uniform single period length and a frequency characteristic according thereto.

The test filter is designed using 3.5 stage ladder type topology as shown in FIG. 8A.

The layout dimensions for all resonators employed for the filter are summarized in Table I below.

TABLE I

| SAW resonators | | aperture length (um) | p (um) | n |
|---|---|---|---|---|
| $SAW_{(S)}$ | $\Pi_p^n$ | 40 | 1.94 | 108 |
| $SAW_{(P)}$ | $\Pi_p^n$ | 65 | 2.02 | 156 |

In FIG. 8A and the above Table I, $SAW_{(s)}$ means series-connected SAW resonator and $SAW_{(p)}$ means parallel-connected SAW resonator.

Figure 8B:
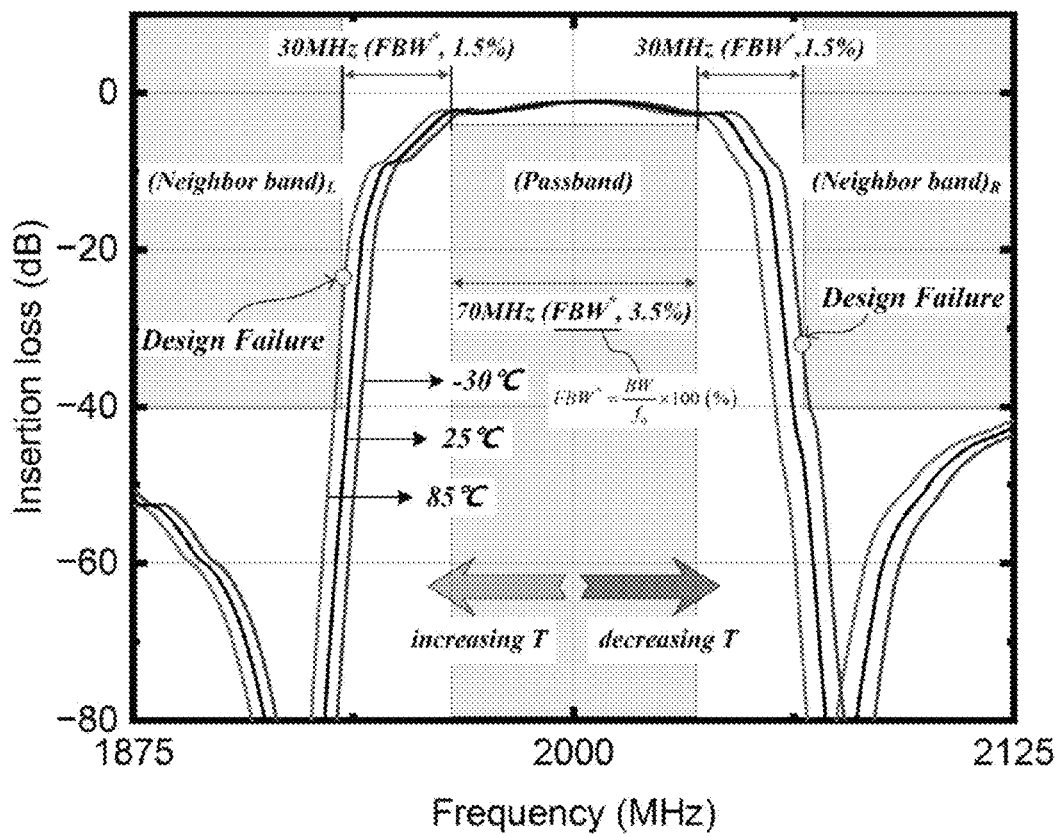

The frequency characteristics compared to insertion loss according to the filter designed by the previous design is shown in FIG. 8B.

As shown in FIG. 8B, the frequency band shift due to the temperature variations from −30° C. to 85° C. have a crucial effect.

The left-side band of the filter crosses the left side guard band with (−23 dB) at 85° C., whereas its right-side band crosses the right-hand-side guard band with (−32 dB) at −30° C. Therefore, although the filter designed by the previous design satisfies the design specification at room temperature, it may lead to fatal design failures with the temperature variations.

Meanwhile, FIG. 9 shows the filter designed by the modulation-based design, which is designed using the modulated resonators as all resonators of the previous design as shown in FIG. 8 are modulated by $\langle \Pi_p^n \rangle_{mod}^2 \to \langle \Pi_{p_1}^{k_1}, \Pi_{p_2}^{k_2} \rangle$. The layout dimensions for resonators according to the modulation are summarized in Table II below.

TABLE II

| | | Layout variables | | | | | |
|---|---|---|---|---|---|---|---|
| SAW resonators | | $L_0$ (um) | $p_1$ (um) | $k_1$ | $p_2$ (um) | $k_2$ | $p_3$ (um) | $k_3$ |
| $mSAW_{(S)}$ | $\langle \Pi_p^n \rangle_{mod}^2$ | 40 | 1.94 | 48 | 1.95 | 60 | 0 | 0 |
| $mSAW_{(P)}$ | $\langle \Pi_p^n \rangle_{mod}^3$ | 65 | 1.99 | 20 | 2.02 | 60 | 2.03 | 76 |

Figure 9A:
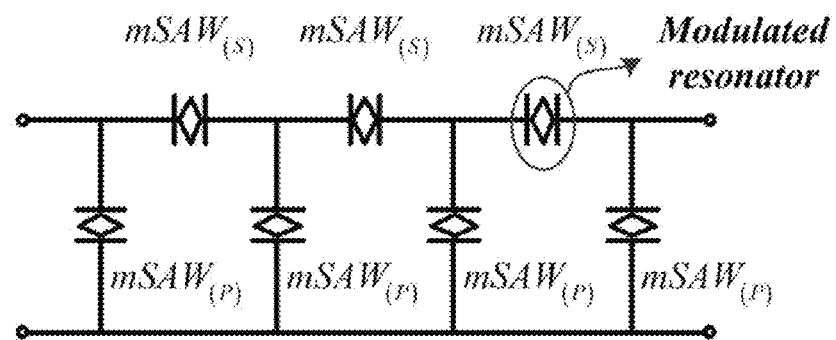
FIGS. 9A and 9B show a SAW filter designed with SAW resonators to which a modulation technique of a resonance frequency according to an embodiment of the present invention is applied, and frequency characteristics according thereto.

As described above, in order to distinguish the modulated resonator from the previous resonator, each resonator in the filter shown in FIG. 9A is shown to include a diamond mark.

In FIG. 9A and the above Table II, $mSAW_{(s)}$ means series-connected modulated SAW resonator and $mSAW_{(p)}$ means parallel-connected modulated SAW resonator.

Figure 9B:
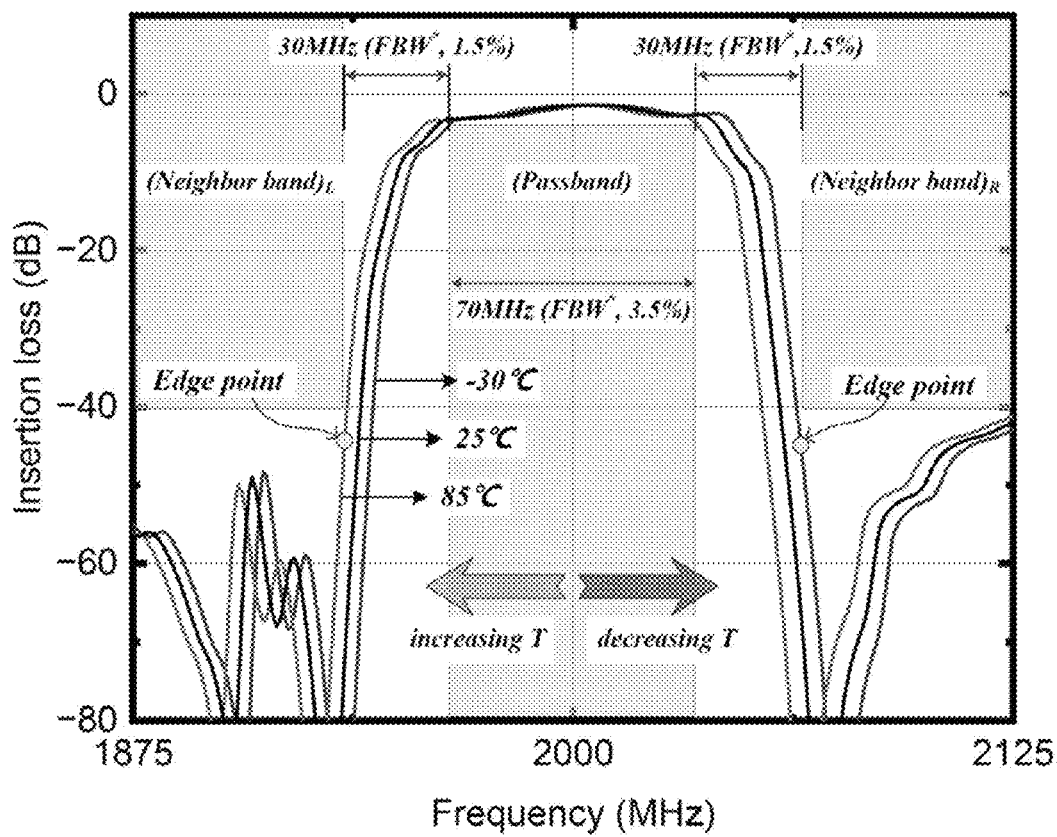

FIG. 9B shows the frequency characteristics compared to insertion loss of the filter designed according to the modulation-based design as described above.

As shown in FIG. 9B, the skirt characteristics of the filter designed with the modulation-based design are improved by 4 MHz from the left and 3 MHz from the right and thus do not intersect each guard band even at a temperature change of −30° C. to 85° C.

That is, as shown in FIG. 9B, the SAW filter designed according to the modulation-based design as described above shows that it is possible to design a SAW filter that is robust to temperature variations by improving the filter skirt characteristics to compensate for temperature variations.

Furthermore, the improvement of the filter skirt characteristics shows that the acoustic RF filter can be designed to be robust to frequency response variations in the passband by compensating for the effects of temperature variations as well as other factors.

What is claimed is:

1. A method of designing an acoustic wave RF filter to be robust to variation in frequency response in pass band through resonance frequency modulation of an interdigital transducer (IDT) electrode, the method comprising:

modulating resonance frequency of the IDT electrode having periodic structure to resonance frequency of a modulated IDT electrode having non-periodic structure by allowing the IDT electrode to have non-periodic fingers;

determining parameters for the modulated IDT electrode of non-periodic structure from changes of resonance frequencies of the acoustic wave resonators having the modulated IDT electrode parallel-connected and the modulated IDT electrode series-connected; and constructing the acoustic wave RF filter by connecting the acoustic wave resonators having the modulated IDT electrode according to the determined parameters in parallel and series.

2. The method according to claim 1, wherein the modulating resonance frequency includes:
   constructing the non-periodic structure of the IDT electrode as a plurality of sub-IDT electrodes having different period lengths; and
   modulating to divide the resonance frequency of the IDT electrode having periodic structure into a plurality of resonance frequencies according to the plurality of sub-IDT electrodes having different period lengths, and to shift an anti-resonance frequency of the IDT electrode having periodic structure to an anti-resonance frequency according to the plurality of sub-IDT electrodes having different period lengths.

3. The method according to claim 2, wherein the determining parameters for the modulated IDT electrode includes:
   determining each period length of each of the plurality of sub-IDT electrodes as the parameters when the amount of the modulated frequency of the resonance frequency of the resonator connected in parallel and an amount of the modulated frequency of the anti-resonance frequency of the resonator connected in series are maximized.

4. A method of designing an acoustic wave RF filter to be robust to variation in frequency response in pass band through resonance frequency modulation of an interdigital transducer (IDT) electrode, the method comprising:
   configuring the IDT electrode with a plurality of fingers having a period length p into m sub-IDTs having different period lengths $p_1$ to $p_m$;
   generating the resonance frequencies $f_{r1}$ to $f_m$ into which are divided according to modulating a resonance frequency $f_r$ of the IDT electrode having period length p to the plurality of sub-IDTs having period lengths $p_1$ to $p_m$;
   generating the anti-resonance frequency $f_{a(m)}$ which is shifted according to modulating an anti-resonance frequency $f_{a(p)}$ of the IDT electrode having period length p to the plurality of sub-IDTs having period lengths $p_1$ to $p_m$;
   determining the period length of each of the plurality of sub-IDTs when the difference between the resonance frequency $f_r$ and the divided resonance frequency for the resonator having the plurality of sub-IDTs connected in parallel and the difference between the anti-resonance frequency $f_{a(p)}$ and the shifted anti-resonance frequency $f_{a(m)}$ for the resonator connected in series is maximized;
   constructing the acoustic wave RF filter by connecting the acoustic wave resonators having the sub-IDTs according to the determined period lengths in parallel and series.

* * * * *